(12) United States Patent
Nishibe et al.

(10) Patent No.: US 10,165,701 B2
(45) Date of Patent: Dec. 25, 2018

(54) ELECTRIC POWER CONVERSION DEVICE FOR PROVIDING A STABILIZED POTENTIAL TO A COOLER

(71) Applicant: TOYOTA JIDOSHA KABUSHIKI KAISHA, Toyota-shi, Aichi-ken (JP)

(72) Inventors: Yuji Nishibe, Nagakute (JP); Yasuyoshi Saito, Nagakute (JP); Kensuke Wada, Nagakute (JP); Shinichi Miura, Toyota (JP); Tadafumi Yoshida, Kasugai (JP); Masayuki Nagao, Toyohashi (JP); Yoshinobu Murakami, Toyohashi (JP); Tomohiro Kawashima, Toyohashi (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 15/640,906

(22) Filed: Jul. 3, 2017

(65) Prior Publication Data

US 2018/0013356 A1    Jan. 11, 2018

(30) Foreign Application Priority Data

Jul. 7, 2016    (JP) ................................. 2016-135233

(51) Int. Cl.
| | |
|---|---|
| *H05K 7/14* | (2006.01) |
| *H02M 7/00* | (2006.01) |
| *H02P 27/06* | (2006.01) |
| *H02M 1/32* | (2007.01) |

(52) U.S. Cl.
CPC .......... *H05K 7/1432* (2013.01); *H02M 7/003* (2013.01); *H02P 27/06* (2013.01); *H02M 2001/327* (2013.01); *H02P 2201/09* (2013.01)

(58) Field of Classification Search
CPC ............ H02M 2001/327; H02M 7/003; H05K 7/1432; H05K 7/2089; H05K 7/209; H05K 7/20936; H05K 7/20945; B60L 2240/525

See application file for complete search history.

(56) References Cited

U.S. PATENT DOCUMENTS

2012/0175948 A1* 7/2012 Kamijo .................. B60L 3/003
307/9.1

FOREIGN PATENT DOCUMENTS

| JP | 2001-268912 A | 9/2001 |
|---|---|---|
| JP | 2003174782 A | 6/2003 |
| JP | 2013-106503 A | 5/2013 |
| JP | 2013-126360 A | 6/2013 |
| JP | 2015-095963 A | 5/2015 |
| JP | 2015-139299 A | 7/2015 |
| JP | 2015149825 A | 8/2015 |

* cited by examiner

*Primary Examiner* — Gary L Laxton
*Assistant Examiner* — Peter Novak
(74) *Attorney, Agent, or Firm* — Sughrue Mion, PLLC

(57) ABSTRACT

In a converter circuit of an electric power conversion device, an adjustment portion divides a voltage of a battery input to a semiconductor module, by a first capacity element and a second capacity element that are connected in series to each other. Then, a middle point between the first capacity element and the second capacity element is connected to a cooler to fix a potential thereof. The electric power conversion device can ensure that a waveform of a surge voltage that is generated on a creepage surface between a lead frame terminal and the cooler has a negative voltage range (a range where an offset voltage is applied).

8 Claims, 17 Drawing Sheets

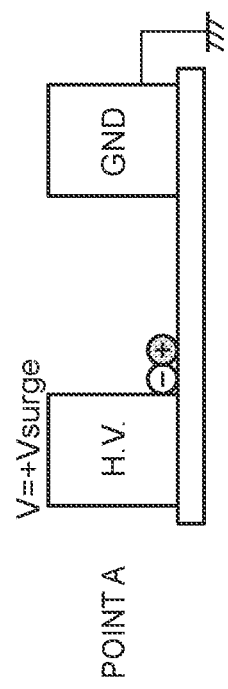
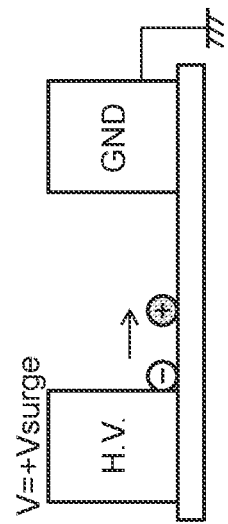
FIG. 9

ELECTRIC POWER CONVERSION DEVICE FOR PROVIDING A STABILIZED POTENTIAL TO A COOLER

INCORPORATION BY REFERENCE

The disclosure of Japanese Patent Application No. 2016-135233 filed on Jul. 7, 2016 including the specification, drawings and abstract is incorporated herein by reference in its entirety.

BACKGROUND

1. Technical Field

The disclosure relates to an electric power conversion device.

2. Description of Related Art

In general, in a vehicle or the like, a voltage of a battery is stepped up by an electric power conversion device and then supplied to a motor that is used to drive the vehicle or the like.

This electric power conversion device is equipped with an inverter circuit and a converter circuit. Semiconductor modules, namely, so-called power cards are employed as the inverter circuit and the converter circuit. Each of the semiconductor modules includes two switching elements that are connected in series to each other, and rectification elements that are connected in an antiparallel manner to the switching elements respectively.

Besides, each of the semiconductor modules is generally sealed by a resin mold. This sealed semiconductor module is laminated on a cooler via an insulating plate.

The electric power conversion device has a problem in that a surge voltage and noise are generated due to the operation of turning on/off the switching elements included in each of the semiconductor modules, the parasitic inductance of wires and the like. In view of this problem, Japanese Patent Application Publication No. 2013-106503 (JP 2013-106503 A) discloses an art for reducing generated noise by equipping an electric power conversion device with noise bypass means that is arranged between a positive electrode frame/a negative electrode frame and a cooler to couple capacities of the positive electrode frame/the negative electrode frame and the cooler.

Besides, Japanese Patent Application Publication No. 2015-95963 (JP 2015-95963 A) discloses an art for suppressing a surge voltage and ringing by providing a snubber circuit between bus bars in an electric power conversion device.

SUMMARY

However, according to the aforementioned conventional art, when the semiconductor modules are downsized, the distance between the cooler and terminals that are provided in the semiconductor modules to connect the semiconductor modules to a battery, a motor and the like becomes short, so the performance of insulation deteriorates in some cases. As described hitherto, according to the conventional art, the performance of insulation of the semiconductor modules and the size of the semiconductor modules conflict each other. Therefore, there is an obstacle to the downsizing of the semiconductor modules.

The disclosure makes a semiconductor smaller than before by enhancing the performance of insulation.

A first aspect of the disclosure is an electric power conversion device. The electric power conversion device includes a semiconductor module and an adjustment portion. The semiconductor module includes a first switching element, a second switching element, a first rectification element, a second rectification element, an output terminal, and a low potential-side terminal. The first switching element and the second switching element are connected in series between a high potential-side terminal and the low potential-side terminal. The first rectification element is connected in an antiparallel manner to the first switching element. The second rectification element is connected in an antiparallel manner to the second switching element. The output terminal is connected to a middle point between the first switching element and the second switching element. The output terminal is connected to a high potential side of a battery. The low potential-side terminal is connected to a low potential side of the battery. The adjustment portion includes a first capacity element, a second capacity element and a cooler. The adjustment portion is configured such that a potential of a middle point between the first capacity element and the second capacity element is equal to a potential of the cooler. The first capacity element and the second capacity element are connected in series between the output terminal and the low potential-side terminal. The cooler is connected to the semiconductor module via an insulating plate. The semiconductor module is sealed by a mold resin.

A second aspect of the disclosure is an electric power conversion device. The electric power conversion device includes an inverter circuit and an adjustment portion. The inverter circuit includes a plurality of semiconductor modules. Each of the plurality of the semiconductor modules includes a first switching element, a second switching element, a first rectification element, a second rectification element, an output terminal, and a low potential-side terminal. The first switching element and the second switching element are connected in series between a high potential-side terminal and the low potential-side terminal. The first rectification element is connected in an antiparallel manner to the first switching element. The second rectification element is connected in an antiparallel manner to the second switching element. The output terminal is connected to a middle point between the first switching element and the second switching element. The output terminal is connected to a high potential side of a battery. The low potential-side terminal is connected to a low potential side of the battery. The adjustment portion includes a series circuit of a first capacity element and a second capacity element, and a cooler. The adjustment portion is configured such that a potential of a middle point between the first capacity element and the second capacity element is equal to a potential of the cooler. The series circuit is connected in parallel to the inverter circuit. The cooler is connected to each of the plurality of the semiconductor modules via an insulating plate. The plurality of the semiconductor modules are sealed by a mold resin.

In the electric power conversion device, the cooler may be provided on each of both surfaces of the semiconductor module, via an insulating plate.

In the electric power conversion device, a capacity of the first capacity element may be different from a capacity of the second capacity element.

A third aspect of the disclosure is an electric power conversion device. The electric power conversion device includes a converter circuit, an inverter circuit and a plurality of coolers. The converter circuit includes a first semiconductor module. The first semiconductor module includes a first switching element, a second switching element, a first rectification element, a second rectification element, a first output terminal, and a first low potential-side terminal. The first switching element and the second switching element are connected in series between a first high potential-side terminal and the first low potential-side terminal. The first rectification element is connected in an antiparallel manner to the first switching element. The second rectification element is connected in an antiparallel manner to the second switching element. The first output terminal is connected to a middle point between the first switching element and the second switching element. The first output terminal is connected to a high potential side of an electric power supply portion to which a first battery and a second battery are connected in series. The first low potential-side terminal is connected to a low potential side of the electric power supply portion. The inverter circuit includes a plurality of second semiconductor modules. Each of the plurality of the second semiconductor modules includes a third switching element, a fourth switching element, a third rectification element, a fourth rectification element, a second output terminal, and a second low potential-side terminal. The third switching element and the fourth switching element are connected in series between a second high potential-side terminal and the second low potential-side terminal. The third rectification element is connected in an antiparallel manner to the third switching element. The fourth rectification element is connected in an antiparallel manner to the fourth switching element. The second output terminal is connected to a middle point between the third switching element and the fourth switching element. The second output terminal is connected to a high potential side of the electric power supply portion. The second low potential-side terminal is connected to a low potential side of the electric power supply portion. The plurality of the coolers are provided for each of the first semiconductor module and the second semiconductor modules via insulating plates respectively. The first semiconductor module and the second semiconductor modules are sealed by a mold resin, via insulating plates respectively. The plurality of the coolers are configured such that a potential thereof is equal to a potential of a middle point between the first battery and the second battery of the electric power supply portion.

In the electric power conversion device, the coolers may be provided on both surfaces of the first semiconductor module and on both surfaces of the second semiconductor modules, via insulating plates respectively.

According to the foregoing configuration, an effect of making it possible to make each of the semiconductor modules smaller than before by enhancing the performance of insulation is obtained.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein:

FIG. 9 is an illustrative view illustrating the behavior of electrical charges at a point A of the surge voltage shown in FIG. 8;

DETAILED DESCRIPTION OF EMBODIMENTS

Figure 1:
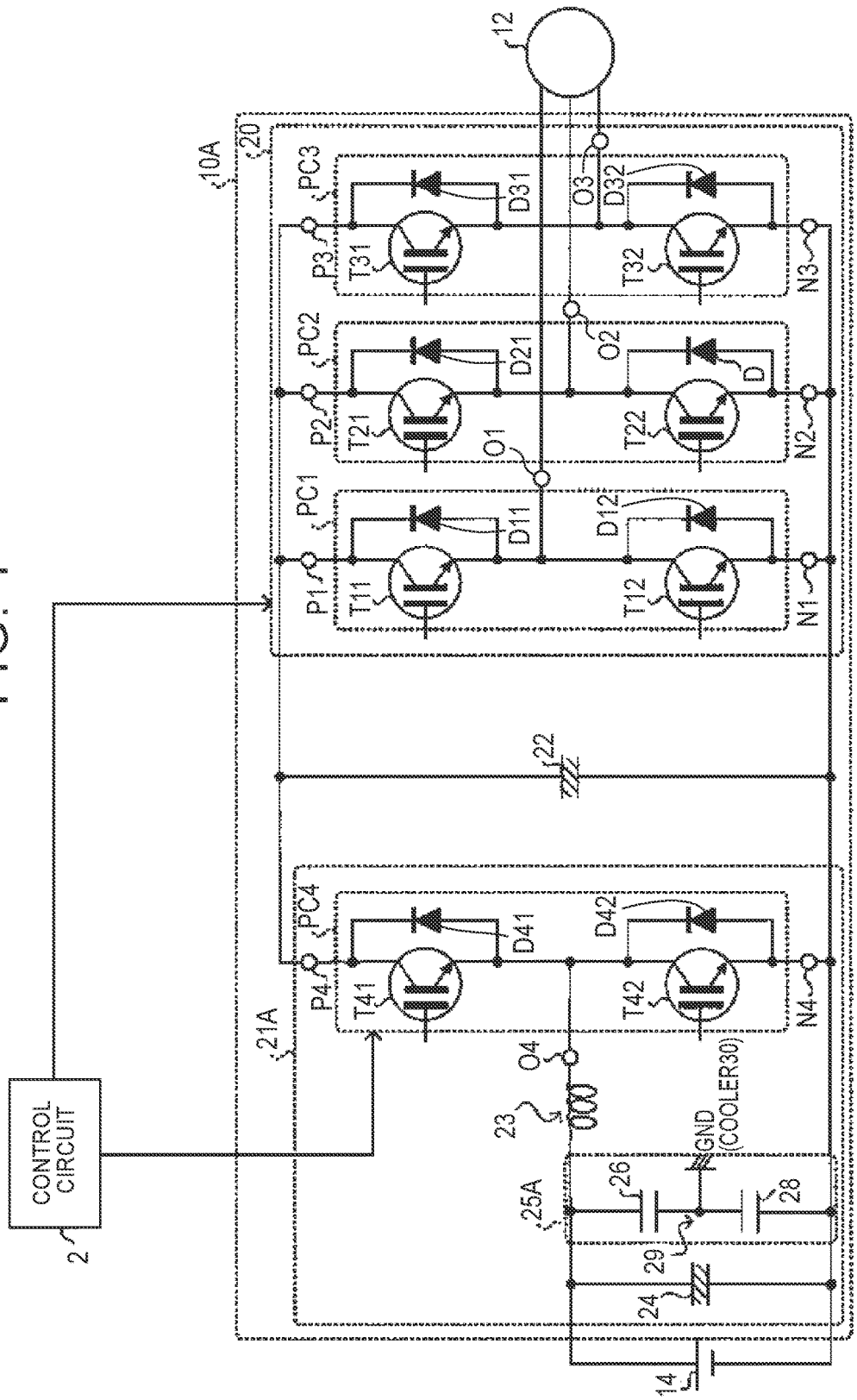
FIG. 1 is a block diagram representing an exemplary configuration of an electric power conversion device according to the first embodiment of the disclosure.

The embodiments of the disclosure will be described hereinafter in detail with reference to the drawings. An electric power conversion device 10A according to the first embodiment of the disclosure shown in FIG. 1 converts an electric power of a battery 14 and supplies the converted electric power as an electric power for driving a motor 12. As shown in FIG. 1, the electric power conversion device 10A according to the present embodiment of the disclosure is equipped with an inverter circuit 20, a converter circuit 21A and a smoothing capacitor 22. The motor 12 is used, for example, to cause a vehicle to run.

The converter circuit 21A according to the present embodiment of the disclosure performs both a step-up operation for stepping up a voltage of the battery 14 and supplying the stepped-up voltage to the inverter circuit 20, and a step-down operation for stepping down a DC electric power input from the inverter circuit 20 side (an electric power generated by the motor 12) and supplying the stepped-down electric power to the battery 14.

The converter circuit 21A is equipped with a power card PC4. The power card PC4 includes switching elements T41 and T42 and rectification elements D41 and D42. One end of the switching element T41 is connected to a P terminal P4 (a high potential side of the battery 14). The other end of the switching element T41 is connected to one end of the switching element T42, and the switching elements T41 and T42 form a series circuit. A middle point of the series circuit is connected to an output terminal O4. Besides, the other end of the switching element T42 is connected to an N terminal N4 (a low potential side of the battery 14). The rectification element D41 is connected in an antiparallel manner to the switching element T41. Besides, the rectification element D42 is connected in an antiparallel manner to the switching element T42.

Besides, the converter circuit 21A is equipped with a reactor 23 that is connected at one end thereof to a middle point of the series circuit formed by the switching element T41 and the switching element T42 (the output terminal O4), and that is connected at the other end thereof to the high potential side of the battery 14. Besides, the converter circuit 21A is equipped with a filter capacitor 24 that is connected between the high potential side and the low potential side of the battery 14.

Furthermore, the converter circuit 21A according to the present embodiment of the disclosure is equipped with an adjustment portion 25A that adjusts the waveform of a surge voltage by fixing the potential of coolers 30. The adjustment portion 25A includes a capacity element 26 and a capacity element 28, which are connected in series between the output terminal O4 (the other end of the reactor 23) and the N terminal N4. A middle point 29 between the capacity element 26 and the capacity element 28 is connected to the coolers 30 (see FIGS. 2 and 3, the details will be described later), and the potential of the coolers 30 is a ground (GND) potential.

Besides, the inverter circuit 20 according to the present embodiment of the disclosure converts a DC electric power stepped up by the converter circuit 21A into an AC electric power. As shown in FIG. 1, the inverter circuit 20 is equipped with power cards PC1, PC2 and PC3.

The power cards PC1 to PC3 are configured in the same manner as the aforementioned power card PC4. In concrete terms, the power card PC1 includes switching elements T11 and T12 and rectification elements D11 and D12. One end of the switching element T11 is connected to a P terminal P1 (the high potential side of the battery 14). The other end of the switching element T11 and one end of the switching element T12 are connected to each other, and the switching elements T11 and T12 form a series circuit. A middle point of the series circuit is connected to an output terminal O1. Besides, the other end of the switching element T12 is connected to an N terminal N1 (the low potential side of the battery 14). The rectification element D11 is connected in an antiparallel manner to the switching element T11. The rectification element D12 is connected in an antiparallel manner to the switching element T12. Besides, the power card PC2 includes switching elements T21 and T22 and rectification elements D21 and D22. One end of the switching element T21 is connected to a P terminal P2 (the high potential side of the battery 14). The other end of the switching element T21 and one end of the switching element T22 are connected to each other, and the switching elements T21 and T22 form a series circuit. A middle point of the series circuit is connected to an output terminal O2. Besides, the other end of the switching element T22 is connected to an N terminal N2 (the low potential side of the battery 14). The rectification element D21 is connected in an antiparallel manner to the switching element T21. The rectification element D22 is connected in an antiparallel manner to the switching element T22. Furthermore, the power card PC3 includes switching elements T31 and T32 and rectification elements D31 and D32. One end of the switching element T31 is connected to a P terminal P3 (the high potential side of the battery 14). The other end of the switching element T31 and one end of the switching element T32 are connected to each other, and the switching elements T31 and T32 form a series circuit. A middle point of the series circuit is connected to an output terminal O3. Besides, the other end of the switching element T32 is connected to an N terminal N3 (the low potential side of the battery 14). The rectification element D31 is connected in an antiparallel manner to the switching element T31. The rectification element D32 is connected in an antiparallel manner to the switching element T32.

The output terminals O1 to O3 are connected to the motor 12. Alternate currents corresponding to a U-phase (not shown), a V-phase (not shown) and a W-phase (not shown) of the motor 12 are output from the output terminals O1 to O3 respectively.

Besides, the smoothing capacitor 22 removes the noise superimposed on an output of the converter circuit 21A. The smoothing capacitor 22 is connected in parallel to the inverter circuit 20 (the P terminals P1 to P3 and the N terminals N1 to N3). Besides, the smoothing capacitor 22 is also connected in parallel to the converter circuit 21A (the P terminal P4 and the N terminal N4).

Each of the switching elements T11, T12, T21, T22, T31, T32, T41 and T42 is controlled to be turned on or off, in accordance with a control signal output from the control circuit 2. The switching elements T11, T12, T21, T22, T31, T32, T41 and T42 are transistor elements. An insulated gate bipolar transistor (IGBT) can be mentioned as a concrete example of each of the transistor elements. Each of the transistor elements is not absolutely required to be an IGBT, but may be another transistor element such as a metal oxide semiconductor field effect transistor (MOSFET) or the like, as long as it is a so-called power semiconductor element that can be used to convert a large-current electric power.

A PIN diode can be mentioned as a concrete example of each of the rectification elements D11, D12, D21, D22, D31, D32, D41 and D42, but another diode may be used.

Next, the hardware configuration of the electric power conversion device 10A according to the present embodiment of the disclosure will be described.

The power cards PC1 to PC4 are so-called power modules, and are semiconductor modules. Reference numerals 1 to 4 for distinguishing the power cards PC1 to PC4 from one another will be hereinafter omitted in the case where the power cards PC1 to PC4 are generically referred to without being distinguished from one another. Besides, reference numerals 11 to 42 for distinguishing the switching elements T11, T12, T21, T22, T31, T32, T41 and T42 will also be omitted in the case where the switching elements T11, T12, T21, T22, T31, T32, T41 and T42 are generically referred to without being distinguished from one another.

Figure 2:
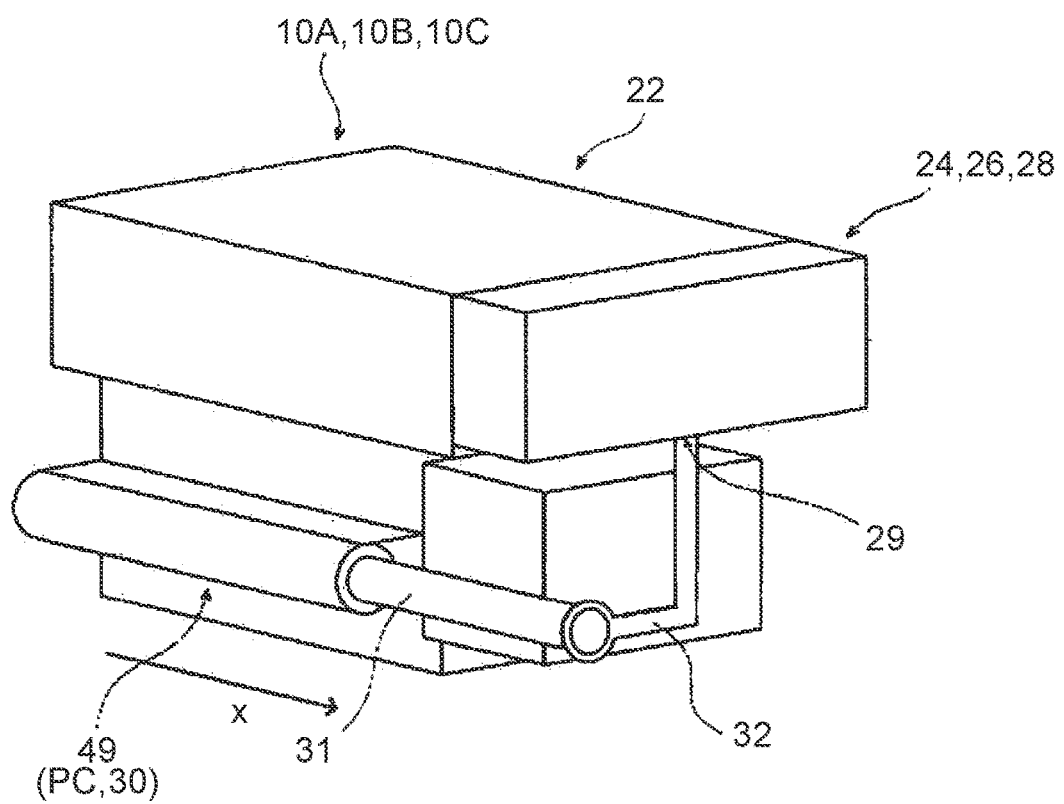
FIG. 2 is a perspective view of the electric power conversion device according to the first embodiment of the disclosure.

FIG. 2 is a perspective view showing the electric power conversion device 10A. The power cards PC and the coolers 30 are alternately laminated on each other. The power cards PC are provided as lamination units 49, each of which has the flat plate-type coolers 30 laminated on both surfaces thereof. The lamination units 49 are laminated on one another in an x-axis direction shown in FIG. 2. Through-holes are provided through the coolers 30 of each of the lamination units 49, and a cooling medium is supplied thereto in a circulating manner through cooler channels 31.

The middle point 29 between the capacity elements 26 and 28 is connected to the each of the cooler channels 31 by each of connection wires 32. As described hitherto, in the electric power conversion device 10A according to the present embodiment of the disclosure, the middle point 29 between the capacity elements 26 and 28 is connected to each of the coolers 30 via each of the connection wires 32 and each of the cooler channels 31.

Figure 3:
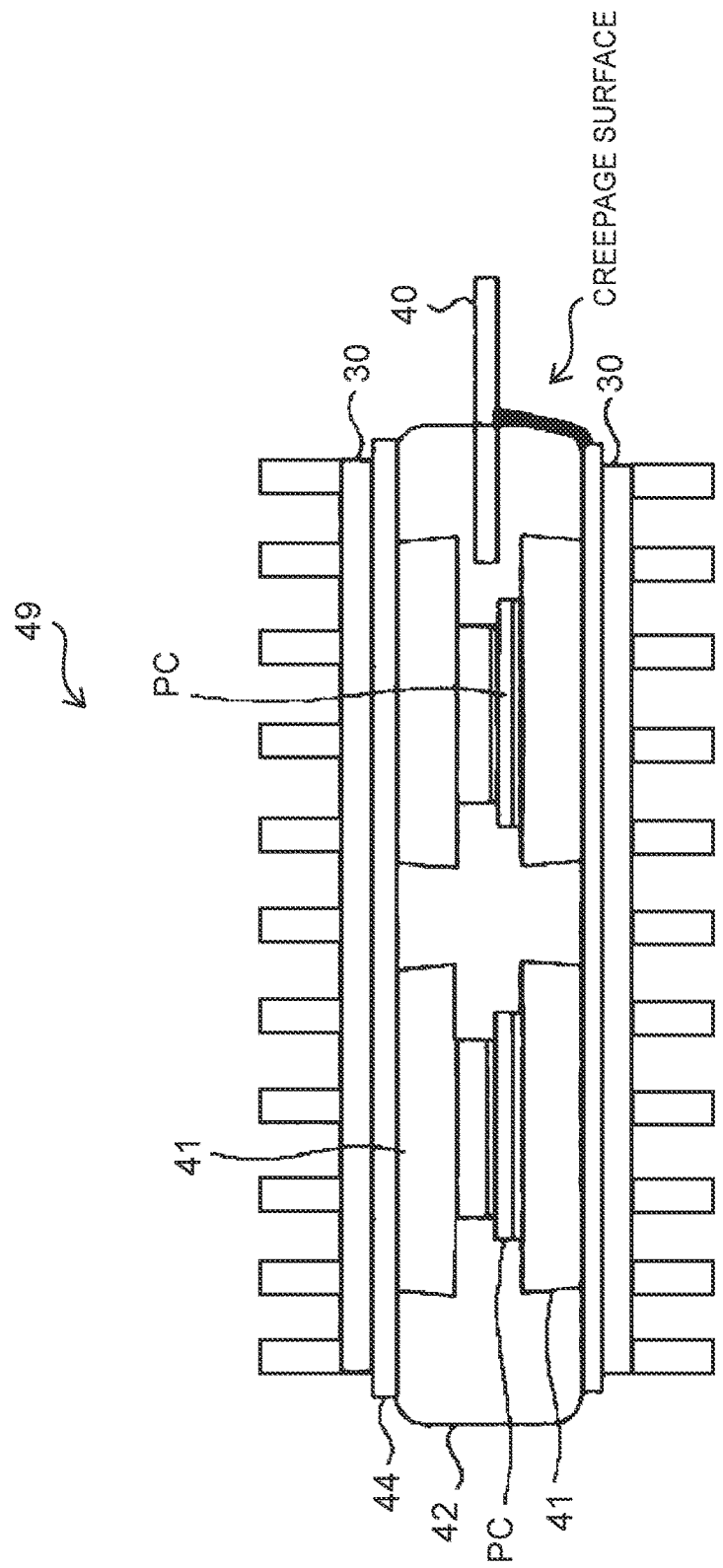
FIG. 3 is a schematic view schematically representing a cross-section of a lamination unit according to the first embodiment of the disclosure, taken in an x-axis direction of FIG. 2.

FIG. 3 is a schematic view schematically representing a cross-section of each of the lamination units 49 taken along the x-axis direction of FIG. 2. The power cards PC are laminated between electrode plates 41 for each combination of the switching elements T and rectification elements D that are connected in an antiparallel manner to the switching elements T respectively, and are sealed by a mold resin 42. As shown in FIG. 3, the coolers 30 are provided on both surfaces of the mold resin 42 (both surfaces thereof in a lamination direction of the power cards PC) via insulating plates 44 respectively.

A lead frame terminal 40 that protrudes outward from inside the mold resin 42 is a terminal for connecting each of the P terminals P, the N terminals N and the output terminals O to the battery 14, the motor 12 and the like. Although not shown in FIG. 3, as is the case with the lead frame terminal 40, each of the connection wires 32 that connects the middle point 29 to each of the coolers 30 also protrudes outward from inside the mold resin 42.

Next, the operation of the electric power conversion device 10A according to the present embodiment of the disclosure will be described.

The adjustment portion 25A according to the present embodiment of the disclosure fixes the potential of each of the coolers 30 by dividing the voltage of the battery 14 input to the power card PC4 by the capacity element 26 and the capacity element 28, and connecting the middle point 29 to each of the coolers 30. The voltage divided by the capacity element 26 and the capacity element 28 will be described.

Figure 4:
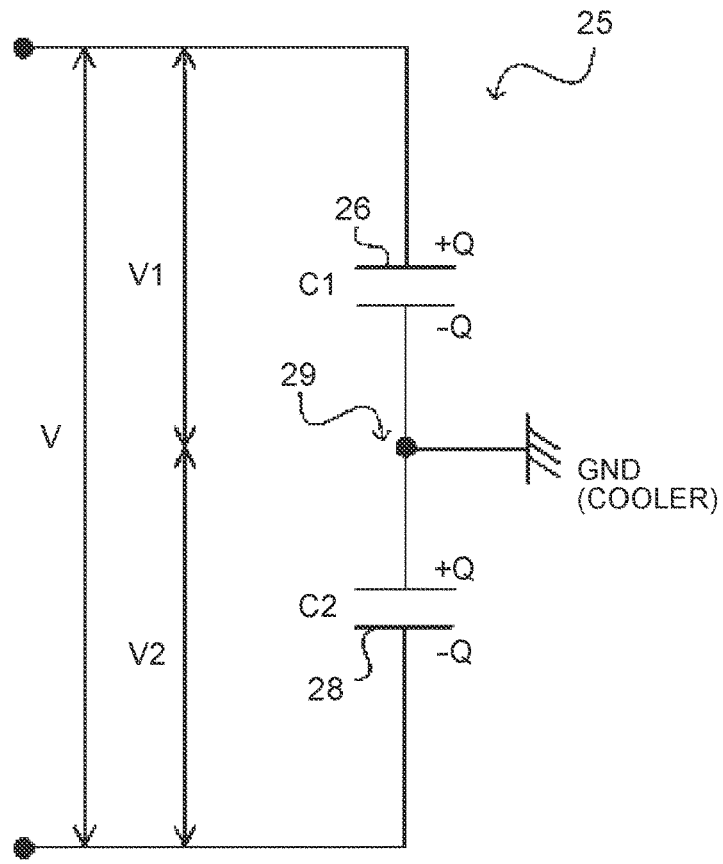
FIG. 4 is an illustrative view illustrating a voltage that is divided by a capacity element of an adjustment portion according to the first embodiment of the disclosure.

As shown in FIG. 4, equations (1) to (3) shown below are established when C1 denotes an electrostatic capacity of the capacity element 26, C2 denotes an electrostatic capacity of the capacity element 28, Q denotes a magnitude of electrical charges with which each of the capacity element 26 and the capacity element 28 is charged, V denotes a battery voltage, V1 denotes a voltage divided by the capacity element 26, and V2 denotes a voltage divided by the capacity element 28.

$$Q = C1 \times V1 \quad (1)$$

$$Q = C2 \times V2 \quad (2)$$

$$V = V1 + V2 \quad (3)$$

An equation (4) shown below is obtained from the aforementioned equations (1) and (2). The equation (4) shown below is rewritten into equations (5) and (6) shown below.

$$C1 \times V1 = C2 \times V2 \quad (4)$$

$$V1 = C2 \times V2 / C1 \quad (5)$$

$$V2 = C1 \times V1 / C2 \quad (6)$$

An equation (7) shown below is obtained from the aforementioned equations (3) and (5). The equation (7) shown below is rewritten into an equation (8) shown below.

$$V = V2 + C2 \times V2 / C1 \quad (7)$$

$$V2 = C1/(C1+C2) \times V \quad (8)$$

An equation (9) shown below is obtained from the aforementioned equations (3) and (6). The equation (9) shown below is rewritten into an equation (10) shown below.

$$V = V1 + C1 \times V1 / C2 \quad (9)$$

$$V1 = C2/(C1+C2) \times V \quad (10)$$

It is apparent from the aforementioned equations (8) and (10) that the voltage V2 rises as the electrostatic capacity C1 of the capacity element 26 increases. Besides, on the contrary, it is apparent that the voltage V1 rises as the electrostatic capacity C2 of the capacity element 28 increases. Accordingly, the potential at which each of the coolers 30 is fixed changes in accordance with (a capacity ratio between) the electrostatic capacity C1 of the capacity element 26 and the electrostatic capacity C2 of the capacity element 28.

Figure 5:
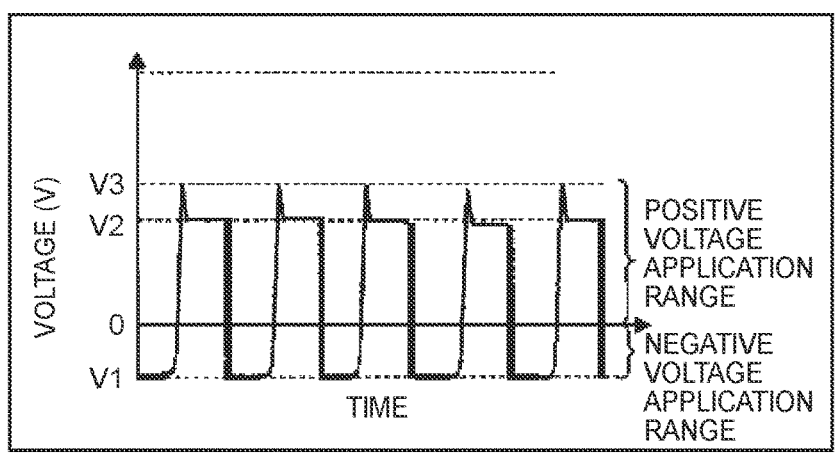
FIG. 5 is a waveform chart showing an exemplary waveform of a surge voltage that is generated between a P terminal of the electric power conversion device according to the first embodiment of the disclosure and a cooler.
Figure 6:
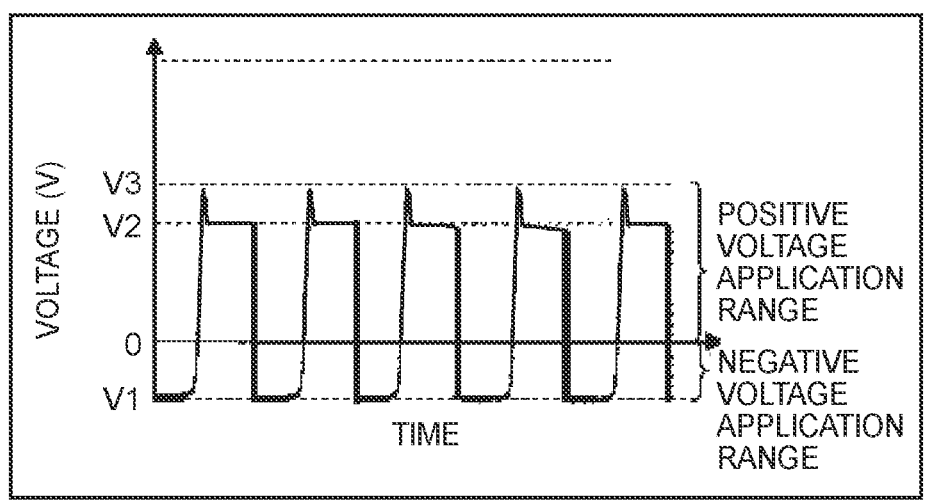
FIG. 6 is a waveform chart showing an exemplary waveform of a surge voltage that is generated between an O terminal of the electric power conversion device according to the first embodiment of the disclosure and the cooler.
Figure 7:
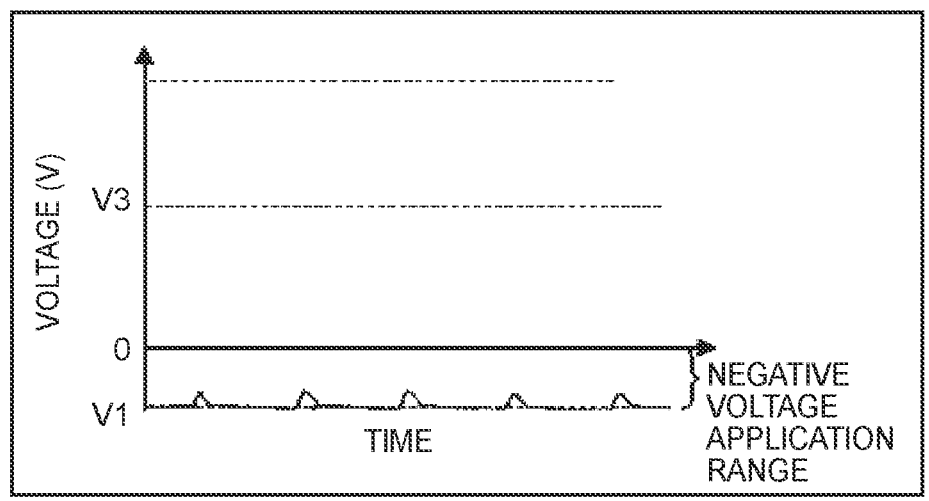
FIG. 7 is a waveform chart showing an exemplary waveform of a surge voltage that is generated between an N terminal of the electric power conversion device according to the first embodiment of the disclosure and the cooler.

Next, a surge voltage that is generated between each terminal and each of the coolers 30 will be described. FIG. 5 shows an exemplary waveform of a surge voltage that is generated between the P terminal P4 of the electric power conversion device 10A according to the present embodiment of the disclosure and each of the coolers 30. Besides, FIG. 6 shows an exemplary waveform of a surge voltage that is generated between the O terminal O4 of the electric power conversion device 10A according to the present embodiment of the disclosure and each of the coolers 30. Furthermore, FIG. 7 shows an exemplary waveform of a surge voltage that is generated between the N terminal N4 of the electric power conversion device 10A according to the present embodiment of the disclosure and each of the coolers 30. Incidentally, each of FIGS. 5 to 7 shows a concrete example in the case where the voltage of the battery 14 is 200 V and the voltage stepped up by the converter circuit 21A (the voltage between the P terminals P1 to P4 and the N terminals N1 to N4) is about several hundred V.

As shown in FIGS. 5 to 7, in the electric power conversion device 10A according to the present embodiment of the disclosure, a negative voltage application range where a negative voltage (an offset voltage) is applied invariably emerges in the waveform of the surge voltage that is generated between each terminal and each of the coolers 30.

In the electric power conversion device 10A according to the present embodiment of the disclosure, the waveform of the surge voltage is a waveform where the negative voltage (offset voltage) application range emerges, as described hitherto. Thus, a creepage surface insulation property of the electric power conversion device 10A is enhanced. Incidentally, in the present embodiment of the disclosure, "a creepage surface" means the surface of the mold resin 42 between the lead frame terminal 40 and each of the coolers 30, as referred to as "creepage surface" in FIG. 3, and "the creepage surface insulation property" means the insulation property of this creepage surface. Incidentally, in FIG. 3, "creepage surface" indicates a surface between the lead frame terminal 40 and one of the coolers 30. However, it goes without saying that a surface between the lead frame terminal 40 and the other cooler 30 is also referred to as "creepage surface".

Figure 8:
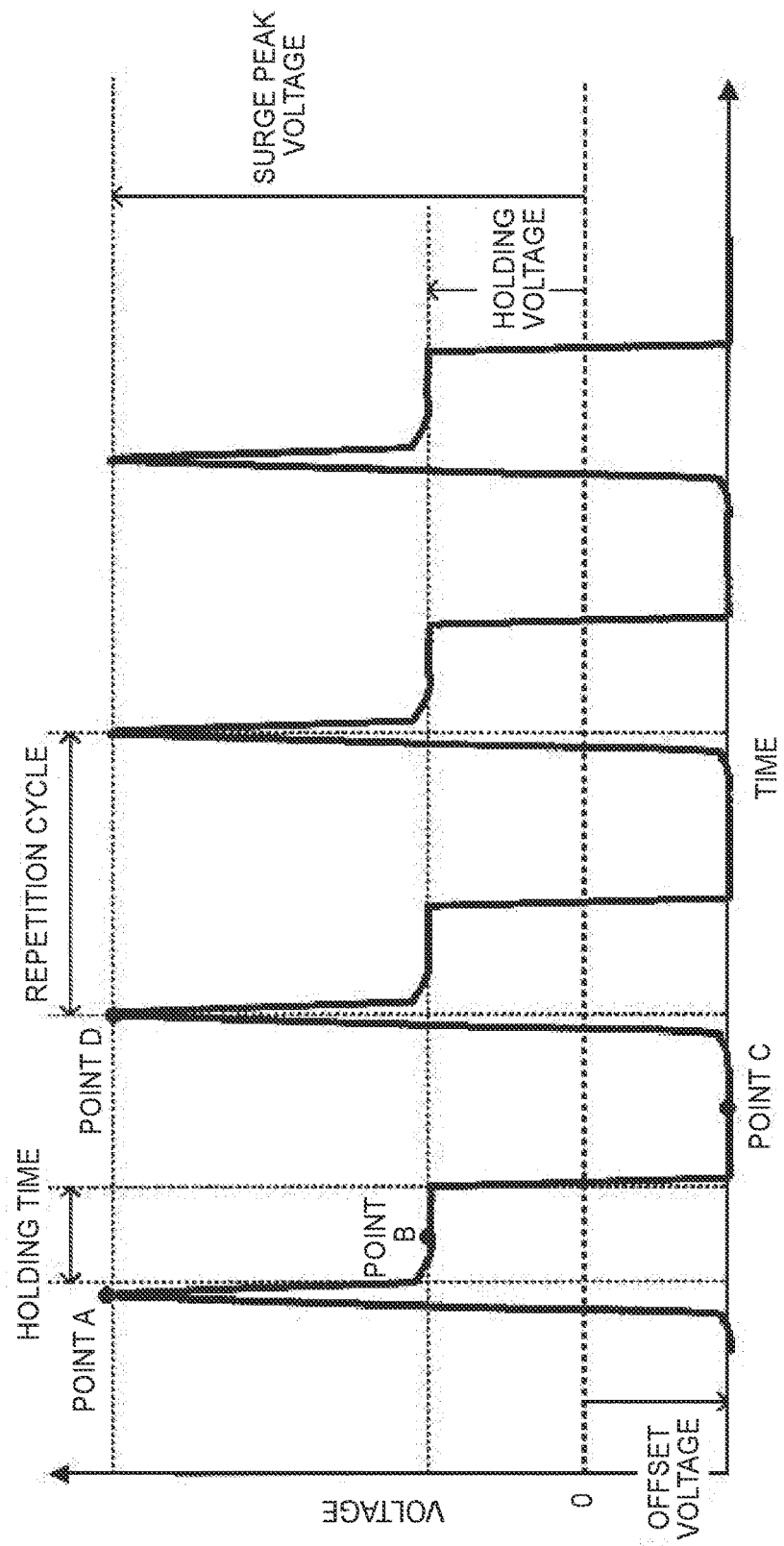
FIG. 8 is a waveform chart showing a waveform of a surge voltage that is generated in the electric power conversion device according to the first embodiment of the disclosure.

A mechanism capable of enhancing the creepage surface insulation property by ensuring that the negative voltage application range emerges in the waveform of the surge voltage will be described with reference to FIGS. 9 to 12, citing as an example a case where a surge voltage having a waveform shown in FIG. 8 is generated.

At a point A where a first surge peak voltage is applied after the start of generation of a surge voltage, the surface of the mold resin 42 is electrified with positive (+) and negative (−) electrical charges through partial discharge equal to or lower than a detection sensitivity, as shown in FIG. 9. In this case, the surge peak voltage is generated in a spike-like manner, so the application time is short. Therefore, the moving distance of positive and negative electrical charges is short, so the positive and negative electrical charges do not reach their opposite electrodes.

Figure 10:
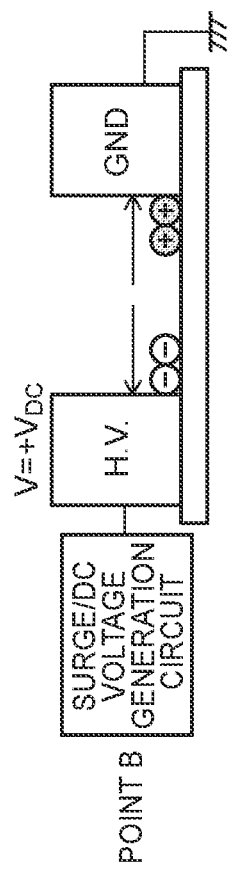
FIG. 10 is an illustrative view illustrating the behavior of electrical charges at a point B of the surge voltage shown in FIG. 8.

As shown in FIG. 10, at a point B, negative electrical charges move toward a high-voltage electrode (H.V.) side, and positive electrical charges move toward a GND electrode side. At the point B, the electrical charges do not disappear, and a holding voltage is applied by an external electric field (see a surge/DC voltage generation circuit in FIG. 10).

Figure 11:
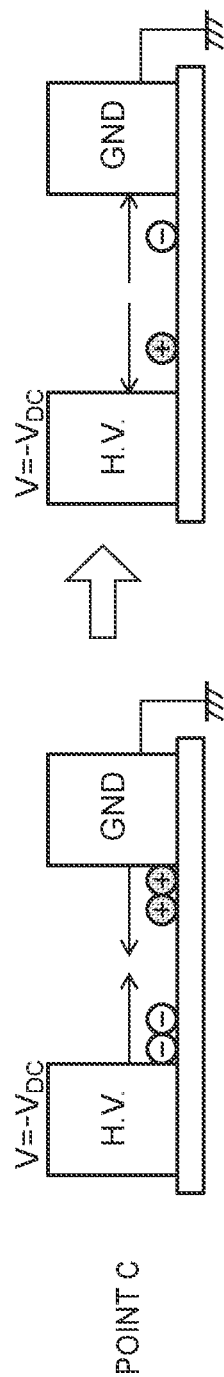
FIG. 11 is an illustrative view illustrating the behavior of electrical charges at a point C of the surge voltage shown in FIG. 8.

At a point C where an offset voltage is applied, positive electrical charges and negative electrical charges move toward the high voltage electrode side and the GND electrode side respectively and hence are neutralized, as shown in FIG. 11. Incidentally, some of both positive and negative electrical charges move to the vicinities of their opposite electrodes.

Figure 12:
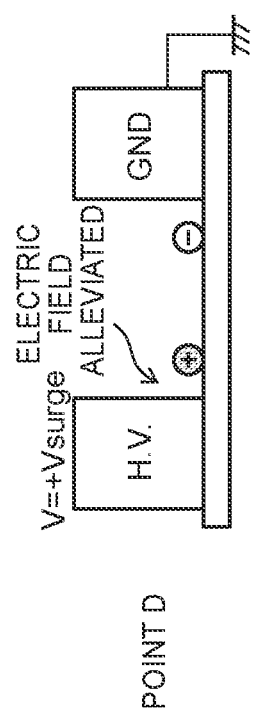
FIG. 12 is an illustrative view illustrating the behavior of electrical charges at a point D of the surge voltage shown in FIG. 8.

Furthermore, at a point D where the surge peak voltage is applied again, positive electrical charges are generated on the high-voltage electrode side, and negative electrical charges are generated on the GND electrode side, as shown in FIG. 12. The generated positive and negative electrical charges act as homo-charges, so electric fields in the vicinities of the respective electrodes are alleviated. Incidentally, homo-charges mean electrical charges that are present in the vicinity of an electrode and identical in polarity to the electrode.

As described hitherto, in the electric power conversion device 10A according to the present embodiment of the disclosure, even when the surge peak voltage is repeatedly applied, the electric fields are alleviated due to the generation of homo-charges, so spark discharge can be restrained from occurring.

Figure 13:
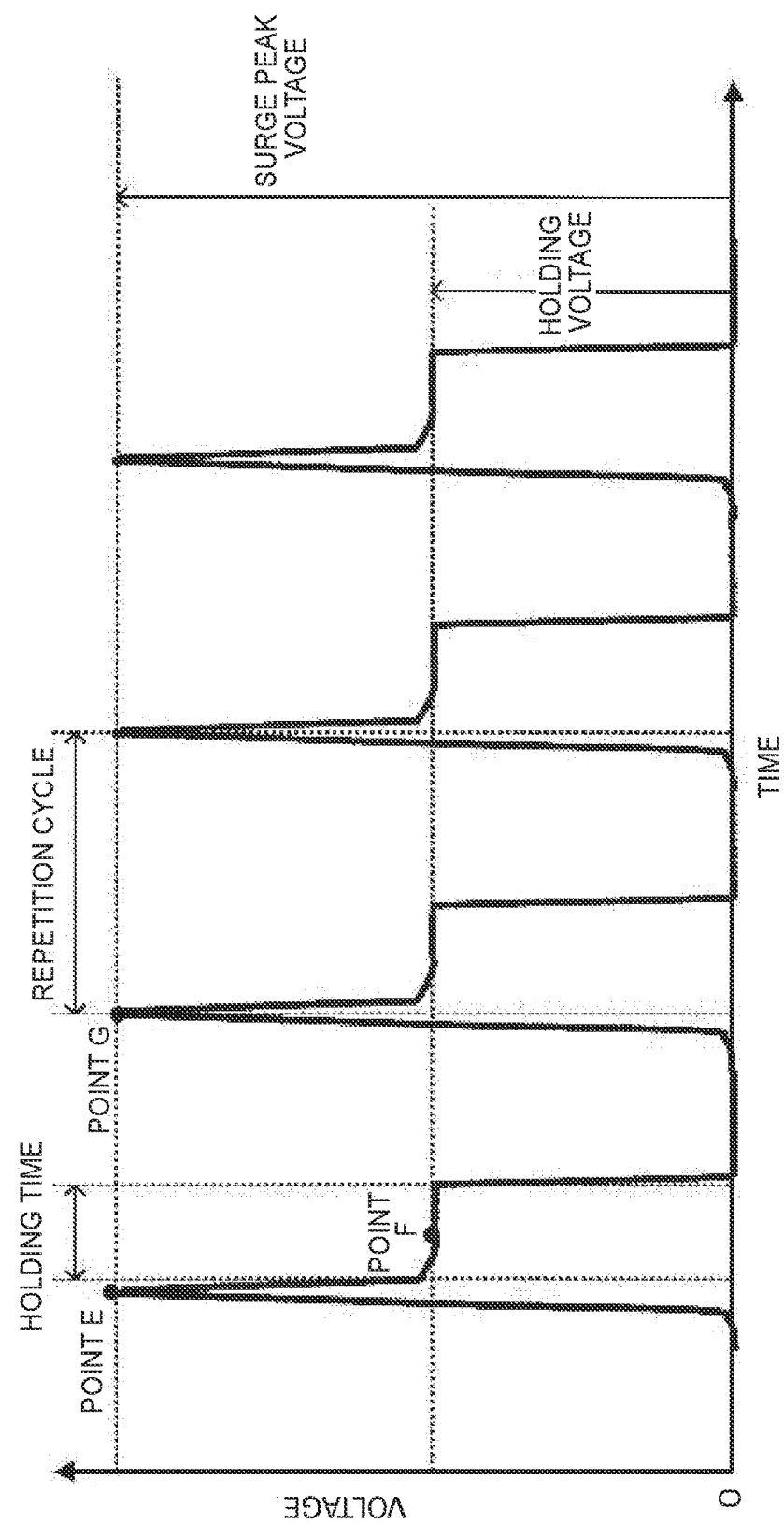
FIG. 13 is a waveform chart showing a waveform of a surge voltage that does not have a negative voltage range, as a comparative example.

For the sake of comparison, a mechanism in the case where there is no negative voltage application range in the waveform of a surge voltage unlike the surge voltage that is generated in the electric power conversion device 10A according to the embodiment of the disclosure and the application of an offset voltage does not take place will now be described with reference to FIGS. 14 to 16, citing as an example a case where a surge voltage having a waveform shown in FIG. 13 is generated.

Figure 14:
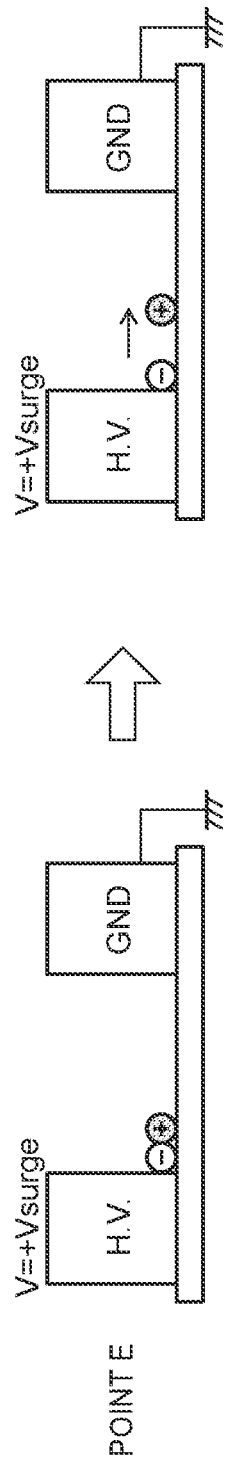
FIG. 14 is an illustrative view illustrating the behavior of electrical charges at a point E of the surge voltage shown in FIG. 13.

At a point E where a first surge peak voltage is applied after the start of generation of a surge voltage, the surface is electrified with positive and negative electrical charges through partial discharge equal to or lower than a detection sensitivity as is the case with the above-mentioned point A, as shown in FIG. 14. In this case, the surge peak voltage is generated in a spike-like manner, so the application time is short. Therefore, the moving distance of positive and negative electrical charges is short, so the positive and negative electrical charges do not reach their opposite electrodes respectively. Incidentally, as is apparent from a comparison between FIG. 8 and FIG. 13, the surge peak voltage (the voltage at the point E) is higher than the voltage at the point A. The surge voltage exemplified in FIG. 13 does not have a negative voltage range, so the surge peak voltage is higher than the surge voltage generated in the electric power conversion device 10A according to the present embodiment of the disclosure.

Figure 15:
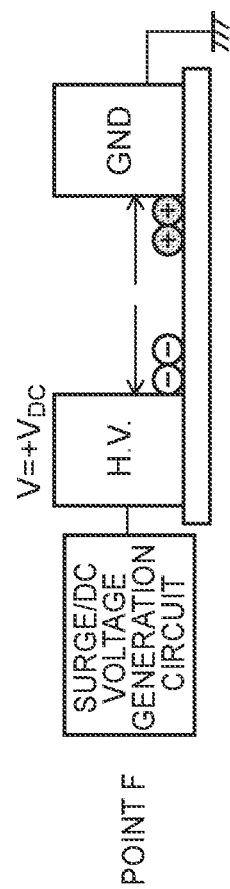
FIG. 15 is an illustrative view illustrating the behavior of electrical charges at a point F of the surge voltage shown in FIG. 13.

At a point F where electrical charges do not disappear and a holding voltage is applied by an external electric field (see a surge/DC voltage generation circuit in FIG. 15), negative and positive electrical charges gradually move toward the high voltage electrode side and the GND electrode side respectively, and reach the vicinities of the electrodes respectively, as shown in FIG. 15 as is the case with the above-mentioned point B.

Figure 16:
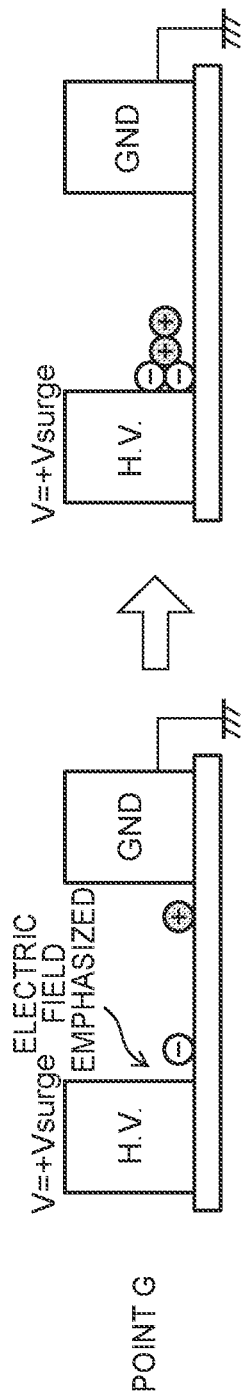
FIG. 16 is an illustrative view illustrating the behavior of electrical charges at a point G of the surge voltage shown in FIG. 13.

Furthermore, at a point G where the surge peak voltage is applied again, electrical charges further move, the electrical charges that have reached their opposite electrodes respectively act as hetero-charges, and electric fields in the vicinities of the respective electrodes are emphasized as shown in FIG. 16. Incidentally, the hetero-charges mean electrical charges that are present in the vicinity of an electrode and reverse in polarity to the electrode.

As described hitherto, in the cases shown in FIGS. 13 to 16, hetero-charges are accumulated due to repeated application of the surge peak voltage, so spark discharge is likely to occur.

In contrast, in the electric power conversion device 10A according to the present embodiment of the disclosure, the adjustment portion 25A divides the voltage of the battery 14 input to the power card PC4, by the capacity element 26 and the capacity element 28 that are connected in series to each other. Also, the middle point 29 between the capacity element 26 and the capacity element 28 is connected to each of the coolers 30 to fix the potential thereof.

Therefore, the electric power conversion device 10A according to the present embodiment of the disclosure can ensure that the waveform of the surge voltage that is generated on the creepage surface between the lead frame terminal 40 and each of the coolers 30 has the negative voltage range (the range where the offset voltage is applied).

Thus, the electric power conversion device 10A according to the present embodiment of the disclosure can enhance the performance of insulation. Besides, the distance between the lead frame terminal 40 and each of the coolers 30 (the distance to the creepage surface) can be made short due to enhancement of the insulation property. Therefore, the semiconductor modules can be made smaller than before.

Incidentally, the pattern of the negative voltage range (the offset voltage) may be adjusted in accordance with the waveform of the surge voltage (the surge peak voltage, the holding voltage, the holding time, the repetition cycle and the like). In this case, the potential at which each of the coolers 30 is fixed may be adjusted by changing the capacity ratio through adjustment of the electrostatic capacity C1 of the capacity element 26 and the electrostatic capacity C2 of the capacity element 28 as described above. For example, in the case where at least one of the value of the surge peak voltage and the holding voltage is high, the insulation life can be enhanced by setting the value of the offset voltage high.

Incidentally, variable capacitors may be applied to the capacity element 26 and the capacity element 28 to make (the capacity ratio between) the electrostatic capacity C1 of the capacity element 26 and the electrostatic capacity C2 of the capacity element 28 in accordance with the control of the control circuit 2 and the like. An electric power conversion device according to the second embodiment of the disclosure has an adjustment portion, which adjusts the waveform of the surge voltage by fixing the potential of each of the coolers 30, provided at a position different from that of the first embodiment of the disclosure.

Next, the electric power conversion device according to the second embodiment of the disclosure will be described. The electric power conversion device according to the present embodiment of the disclosure includes a configuration similar to that of the electric power conversion device according to the first embodiment of the disclosure (see FIG. 1 and the like). Therefore, like components will be denoted by like reference symbols, and detailed description thereof will be omitted.

Figure 17:
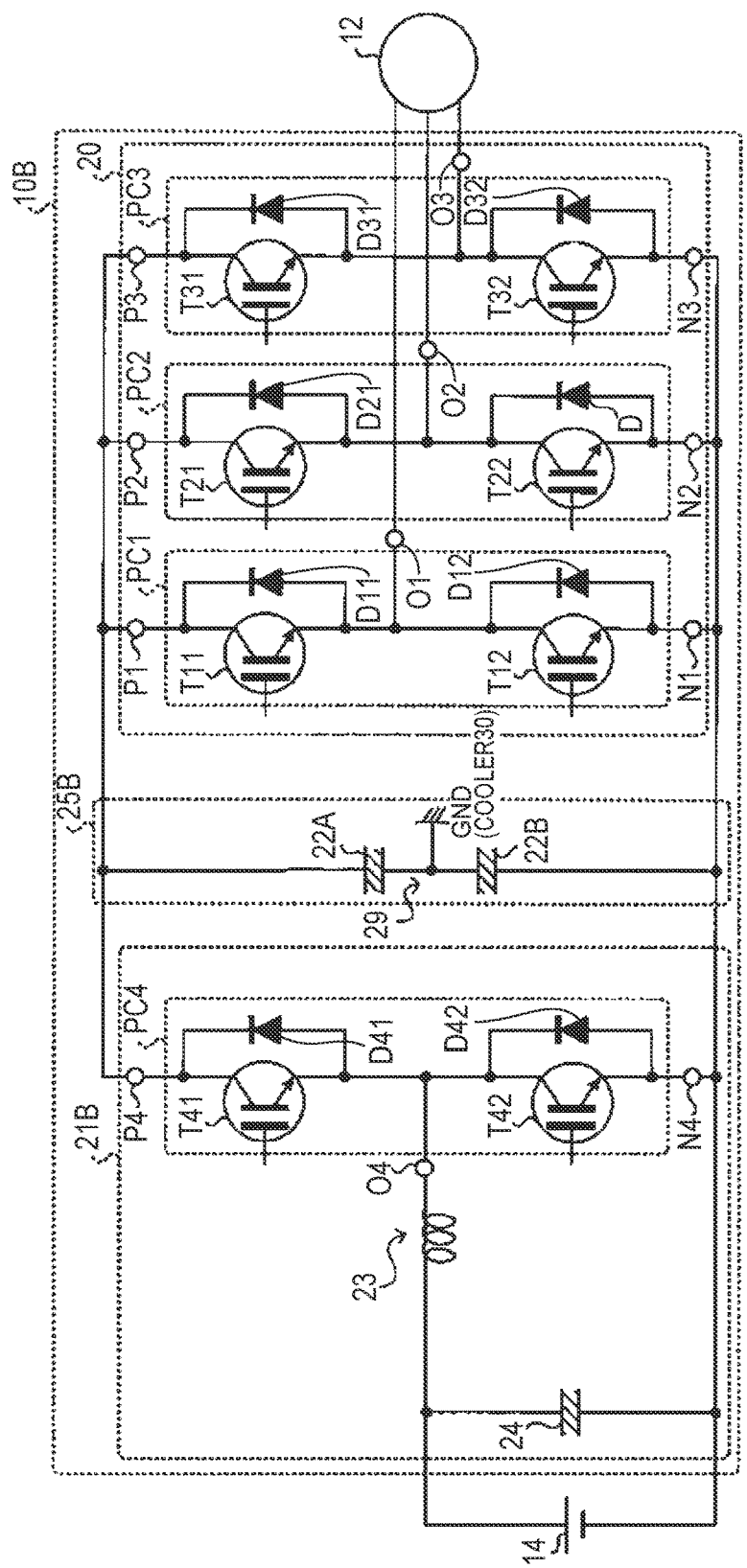
FIG. 17 is a block diagram representing an exemplary configuration of an electric power conversion device according to the second embodiment of the disclosure.

As shown in FIG. 17, unlike the electric power conversion device 10A according to the first embodiment of the disclosure (see FIG. 1), a converter circuit 21B of an electric power conversion device 10B according to the present embodiment of the disclosure is not provided with the adjustment portion 25A. The electric power conversion device 10B according to the present embodiment of the disclosure is provided with an adjustment portion 25B that functions similarly to the adjustment portion 25A according to the first embodiment of the disclosure, instead of the smoothing capacitor 22 according to the first embodiment of the disclosure (see FIG. 1). Incidentally, the control circuit 2 is not shown in FIG. 17.

As shown in FIG. 17, the adjustment portion 25B is a series circuit including smoothing capacitors 22A and 22B that are connected in series between the P terminals (P1, P2 and P3) and the N terminals (N1, N2, N3 and N4) of the inverter circuit 20. The middle point 29 between the smoothing capacitor 22A and the smoothing capacitor 22B is connected to each of the coolers 30, and the potential of each of the coolers 30 is the ground (GND) potential.

Therefore, in the electric power conversion device 10B according to the present embodiment of the disclosure as well as the electric power conversion device 10A according to the first embodiment of the disclosure, the potential of each of the coolers 30 is fixed to a stable potential, and besides, it is possible to ensure that the waveform of the surge voltage has a negative voltage range.

Accordingly, in the electric power conversion device 10B according to the present embodiment of the disclosure as well as the electric power conversion device 10A according to the first embodiment of the disclosure, the performance of insulation can be enhanced. Besides, the distance between the lead frame terminal 40 and each of the coolers 30 (the distance to the creepage surface) can be made short through enhancement of the insulation property, so the semiconductor modules can be made smaller than before.

Figure 18:
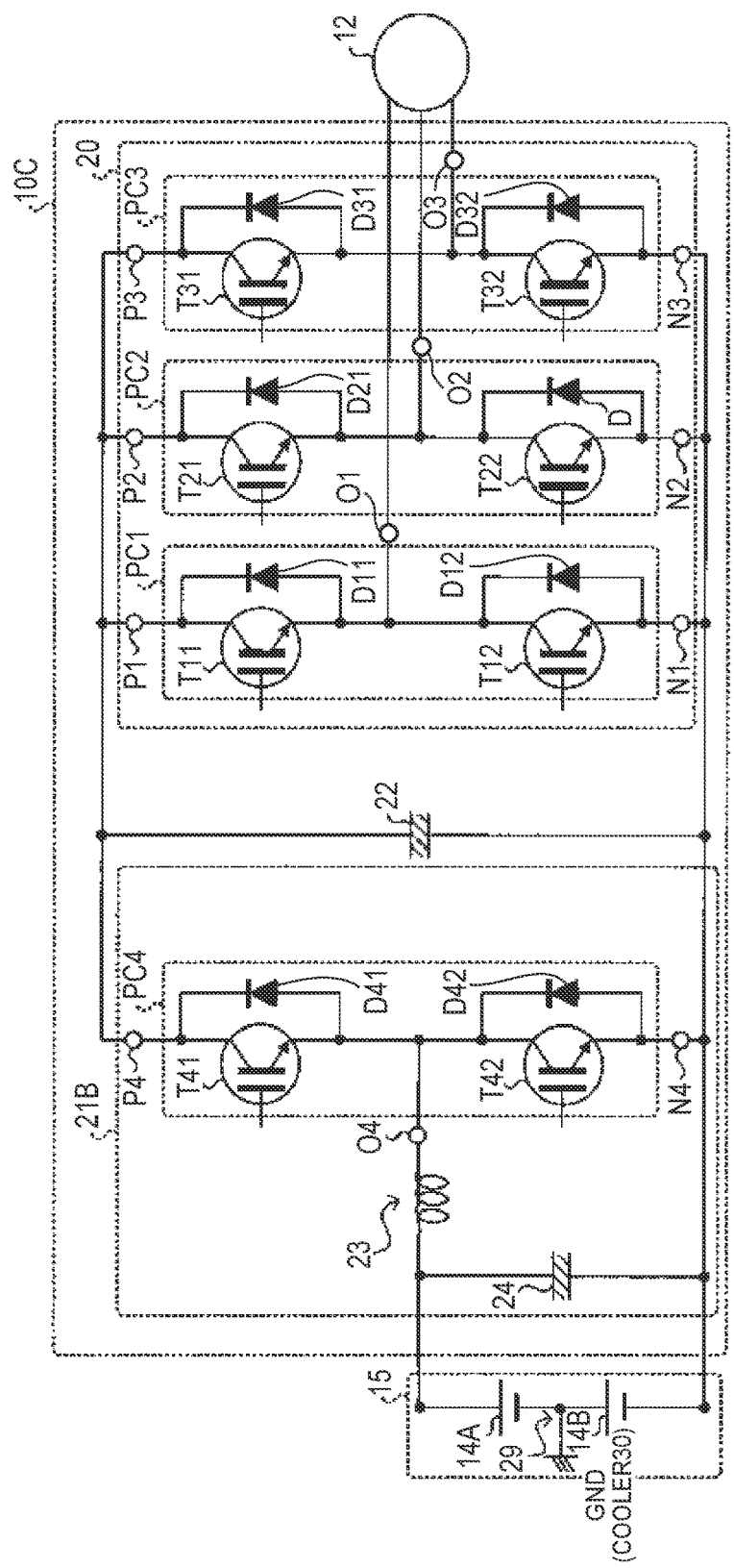
FIG. 18 is a block diagram representing an exemplary configuration of an electric power conversion device according to the third embodiment of the disclosure.

Next, the third embodiment of the disclosure will be described. As shown in FIG. 18, an electric power conversion device according to the present embodiment of the disclosure is different from those according to the aforementioned respective embodiments of the disclosure in the place where the potential of each of the coolers is fixed (the connection destination to which each of the coolers is connected). Incidentally, an electric power conversion device 10C according to the present embodiment of the disclosure includes a configuration similar to those of the electric power conversion devices according to the aforementioned respective embodiments of the disclosure (see FIGS. 1 and 17 and the like). Therefore, like components will be denoted by like reference symbols, and detailed description thereof will be omitted.

In the electric power conversion device 10C according to the present embodiment of the disclosure, a voltage is supplied from an electric power supply portion 15 instead of the battery 14 according to the aforementioned respective embodiments of the disclosure.

The electric power supply portion 15 is a series circuit equipped with a battery 14A and a battery 14B that are connected in series to each other. A high potential side of the battery 14A and a low potential side of the battery 14B are connected to the converter circuit 21B of the electric power conversion device 10C. The electric power supply portion 15 functions similarly to the adjustment portions 25A and 25B according to the aforementioned respective embodiments of the disclosure.

The middle point 29 between the battery 14A and the battery 14B is connected to each of the coolers 30, and the potential of each of the coolers 30 is the ground (GND) potential. That is, in the electric power conversion device 10C according to the present embodiment of the disclosure, the voltage of the battery 14 according to the aforementioned respective embodiments of the disclosure is divided through the use of the series circuit equipped with the battery 14A and the battery 14B, and the potential of each of the coolers 30 is fixed to the divided voltage.

Therefore, in the electric power conversion device 10C according to the present embodiment of the disclosure as well as the electric power conversion devices 10A and 10B according to the aforementioned respective embodiments of the disclosure, the potential of each of the coolers 30 is fixed to a stable potential. Besides, it is possible to ensure that the waveform of the surge voltage has a negative voltage range.

Accordingly, in the electric power conversion device 10C according to the present embodiment of the disclosure as well as the electric power conversion devices 10A and 10B according to the aforementioned respective embodiments of the disclosure, the performance of insulation can be enhanced. Besides, the distance between the lead frame terminal 40 and each of the coolers 30 (the distance to the creepage surface) can be made short through enhancement of the insulation property, so the semiconductor modules can be made smaller than before.

As described above, in each of the electric power conversion devices 10A, 10B and 10C according to the aforementioned respective embodiments of the disclosure, the potential of each of the coolers 30 is fixed to a stable potential generated by each of the electric power conversion devices 10A, 10B and 10C, so the waveform of the generated surge voltage has a negative voltage range (a range where the offset voltage is applied).

Therefore, in each of the electric power conversion devices 10A, 10B and 10C according to the aforementioned respective embodiments of the disclosure, the creepage surface insulation property in each of the power cards PC can be enhanced. Then, the semiconductor modules can be made smaller than before through enhancement of the insulation property.

Besides, each of the electric power conversion devices 10A, 10B and 10C according to the aforementioned respective embodiments of the disclosure can stabilize the potential without, for example, grounding each of the coolers 30, by fixing the potential thereof to a stable potential generated by each of the electric power conversion devices 10A, 10B and 10C.

Incidentally, in each of the electric power conversion devices 10A, 10B and 10C according to the aforementioned respective embodiments of the disclosure, the case where the coolers 30 are laminated on both the surfaces of the power card PC respectively (see FIG. 3) has been described. However, the cooler 30 may be laminated only on one surface of the power card PC.

Incidentally, it goes without saying that the configurations, operations and the like of the electric power conversion devices 10A, 10B and 10C and the like described in the present embodiments of the disclosure are examples and can be changed depending on the situation within such a range as no to depart from the gist of the disclosure.

What is claimed is:

1. An electric power conversion device comprising:
   a semiconductor module that includes a first switching element, a second switching element, a first rectification element, a second rectification element, an output terminal, a high potential-side terminal, and a low potential-side terminal,
   the first switching element and the second switching element being connected in series between the high potential-side terminal and the low potential-side terminal,
   the first rectification element being connected in an antiparallel manner to the first switching element,
   the second rectification element being connected in an antiparallel manner to the second switching element,
   the output terminal being connected to a middle point between the first switching element and the second switching element, and being connected to a high potential side of a battery, and
   the low potential-side terminal being connected to a low potential side of the battery; and
   an adjustment portion that includes a first capacitive element, a second capacitive element, and a cooler, the adjustment portion being configured such that a potential of a middle point between the first capacitive element and the second capacitive element is equal to a potential of the cooler,
   the first capacitive element and the second capacitive element being connected in series between the output terminal and the low potential-side terminal of the semiconductor module, and
   the cooler being connected to the semiconductor module via an insulating plate, the semiconductor module being sealed by a mold resin.

2. The electric power conversion device according to claim 1, wherein
   the cooler comprises a first cooling plate and a second cooling plate, and the first cooling plate and the second cooling plate are respectively provided on two opposite surfaces of the semiconductor module.

3. The electric power conversion device according to claim 1, wherein
   a capacitance of the first capacitive element is different from a capacitance of the second capacitive element.

4. An electric power conversion device comprising:
   an inverter circuit that includes a plurality of first semiconductor modules,
      each of the plurality of first semiconductor modules including a first switching element, a second switching element, a first rectification element, a second rectification element, an output terminal, a high potential-side terminal, and a low potential-side terminal,
      the first switching element and the second switching element being connected in series between the high potential-side terminal and the low potential-side terminal,
      the first rectification element being connected in an antiparallel manner to the first switching element,
      the second rectification element being connected in an antiparallel manner to the second switching element,
      the output terminal of the inverter circuit being connected to a middle point between the first switching element and the second switching element,
      the low potential-side terminal being connected to a low potential side of a battery;
   a second semiconductor module including a third switching element and a fourth switching element which are connected to each other in series, the second semiconductor module being connected in parallel to the inverter circuit; and
   an adjustment portion that includes a series circuit of a first capacitive element and a second capacitive element, and a cooler, the adjustment portion being configured such that a potential of a middle point between the first capacitive element and the second capacitive element is equal to a potential of the cooler,
      the series circuit being connected in parallel to the inverter circuit, and between a middle point of the two series-connected switching elements and a low potential-side terminal of the second semiconductor module, and
      the cooler being connected to each of the plurality of first semiconductor modules via an insulating plate, the plurality of first semiconductor modules being sealed by a mold resin.

5. The electric power conversion device according to claim 4, wherein
   the cooler comprises a first cooling plate and a second cooling plate, and the first cooling plate and the second cooling plate are respectively provided on two opposite surfaces of each of the plurality of first semiconductor modules.

6. The electric power conversion device according to claim 4, wherein
   a capacitance of the first capacitive element is different from a capacitance of the second capacitive element.

7. An electric power conversion device comprising:
   a converter circuit that includes a first semiconductor module,
      the first semiconductor module including a first switching element, a second switching element, a first rectification element, a second rectification element, a first output terminal, a first high potential-side terminal, and a first low potential-side terminal,
      the first switching element and the second switching element being connected in series between the first high potential-side terminal and the first low potential-side terminal,
      the first rectification element being connected in an antiparallel manner to the first switching element,
      the second rectification element being connected in an antiparallel manner to the second switching element,
      the first output terminal being connected to a middle point between the first switching element and the second switching element, and being connected to a high potential side of an electric power supply portion to which a first battery and a second battery are connected in series, and the first low potential-side terminal being connected to a low potential side of the electric power supply portion;
a capacitive element that is disposed between the middle point of the first switching element and the second switching element and the first low potential-side terminal;
an inverter circuit that includes a plurality of second semiconductor modules,
  each of the plurality of second semiconductor modules including a third switching element, a fourth switching element, a third rectification element, a fourth rectification element, a second output terminal, a second high potential-side terminal, and a second low potential-side terminal,
    the third switching element and the fourth switching element being connected in series between the second high potential-side terminal and the second low potential-side terminal,
    the third rectification element being connected in an antiparallel manner to the third switching element,
    the fourth rectification element being connected in an antiparallel manner to the fourth switching element,
    the second output terminal being connected to a middle point between the third switching element and the fourth switching element,
    the second low potential-side terminal of the inverter circuit being connected to the low potential side of the electric power supply portion; and
a plurality of coolers that are provided for each of the first semiconductor module and the second semiconductor modules, the first semiconductor module and the second semiconductor modules being sealed by a mold resin,
the coolers being configured such that a potential of the coolers is equal to a potential of a middle point between the first battery and the second battery of the electric power supply portion.

8. The electric power conversion device according to claim 7, wherein
  each of the coolers comprises a first cooling plate and a second cooling plate, and the first cooling plate and the second cooling plate are respectively provided on two opposite surfaces of the first semiconductor module and two opposite surfaces of the second semiconductor modules.

* * * * *